United States Patent [19]
Yamazaki

[11] Patent Number: 5,999,027
[45] Date of Patent: *Dec. 7, 1999

[54] PHASE COMPENSATING APPARATUS AND DELAY CONTROLLING CIRCUIT

[75] Inventor: Hiroshi Yamazaki, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/654,975

[22] Filed: May 28, 1996

[30] Foreign Application Priority Data

Jun. 13, 1995 [JP] Japan .................................... 7-146132

[51] Int. Cl.$^6$ ........................................................ H03L 7/00
[52] U.S. Cl. ........................... 327/161; 327/159; 327/292; 327/276; 327/261
[58] Field of Search ............................ 327/149, 150–153, 327/158, 159, 161, 146, 155, 233–236, 243–245, 250, 251, 261, 263, 276, 292

[56] References Cited

U.S. PATENT DOCUMENTS

| | | | |
|---|---|---|---|
| 4,604,582 | 8/1986 | Strenkowski et al. | 327/152 |
| 4,637,018 | 1/1987 | Flora et al. | 327/152 |
| 4,795,985 | 1/1989 | Gailbreath, Jr. | 327/158 |
| 5,079,519 | 1/1992 | Ashby et al. | 331/17 |
| 5,087,829 | 2/1992 | Ishibashi et al. | 327/152 |
| 5,118,975 | 6/1992 | Hillis et al. | 327/158 |
| 5,164,677 | 11/1992 | Hawkins et al. | 327/158 |
| 5,173,617 | 12/1992 | Alsup et al. | 327/158 |
| 5,218,314 | 6/1993 | Efendovich et al. | 327/149 |
| 5,223,755 | 6/1993 | Richley | 331/1 A |
| 5,252,867 | 10/1993 | Sorrells et al. | 327/152 |
| 5,289,135 | 2/1994 | Hoshino et al. | 327/261 |
| 5,355,037 | 10/1994 | Andresen et al. | 327/159 |
| 5,471,165 | 11/1995 | Liedberg | 327/250 |
| 5,491,438 | 2/1996 | Miyazaki et al. | 327/146 |
| 5,528,200 | 6/1996 | Yamauchi et al. | 331/57 |
| 5,537,069 | 7/1996 | Volk | 327/149 |
| 5,614,855 | 3/1997 | Lee et al. | 327/158 |
| 5,633,608 | 5/1997 | Danger | 327/158 |
| 5,815,016 | 9/1998 | Erickson | 327/158 |

FOREIGN PATENT DOCUMENTS 4-207520  7/1992  Japan .................................... 327/161

*Primary Examiner*—Timothy P. Callahan
*Assistant Examiner*—Eunja Adolphe
*Attorney, Agent, or Firm*—Staas & Halsey LLP

[57] ABSTRACT

A delay/digital converting circuit in a phase compensating apparatus detects a time period after a measurement start signal that is an internal clock signal is input, until a measurement end signal that is an output signal of a digital/delay converting circuit is input, and outputs the resultant data as digital data to a digital/delay converting circuit. The delay/digital converting circuit outputs the difference between the cycle of an external clock signal and an amount of delay time of a clock distributing circuit as the digital data. The digital/delay converting circuit delays the external clock signal according to the digital data. An internal clock signal which is the output signal of the digital/delay converting circuit that has been delayed by the clock distributing circuit is a signal that has a delay for one cycle of the external clock signal. Thus, the phase of the external clock signal accords with the phase of the internal clock signal.

25 Claims, 16 Drawing Sheets

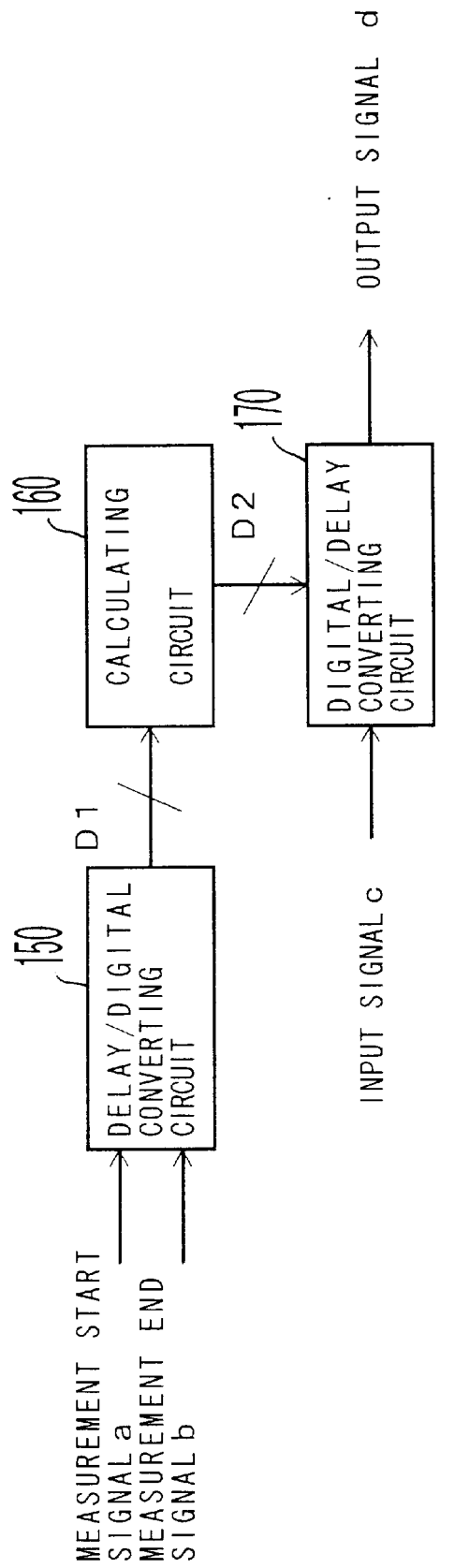
F I G. 8

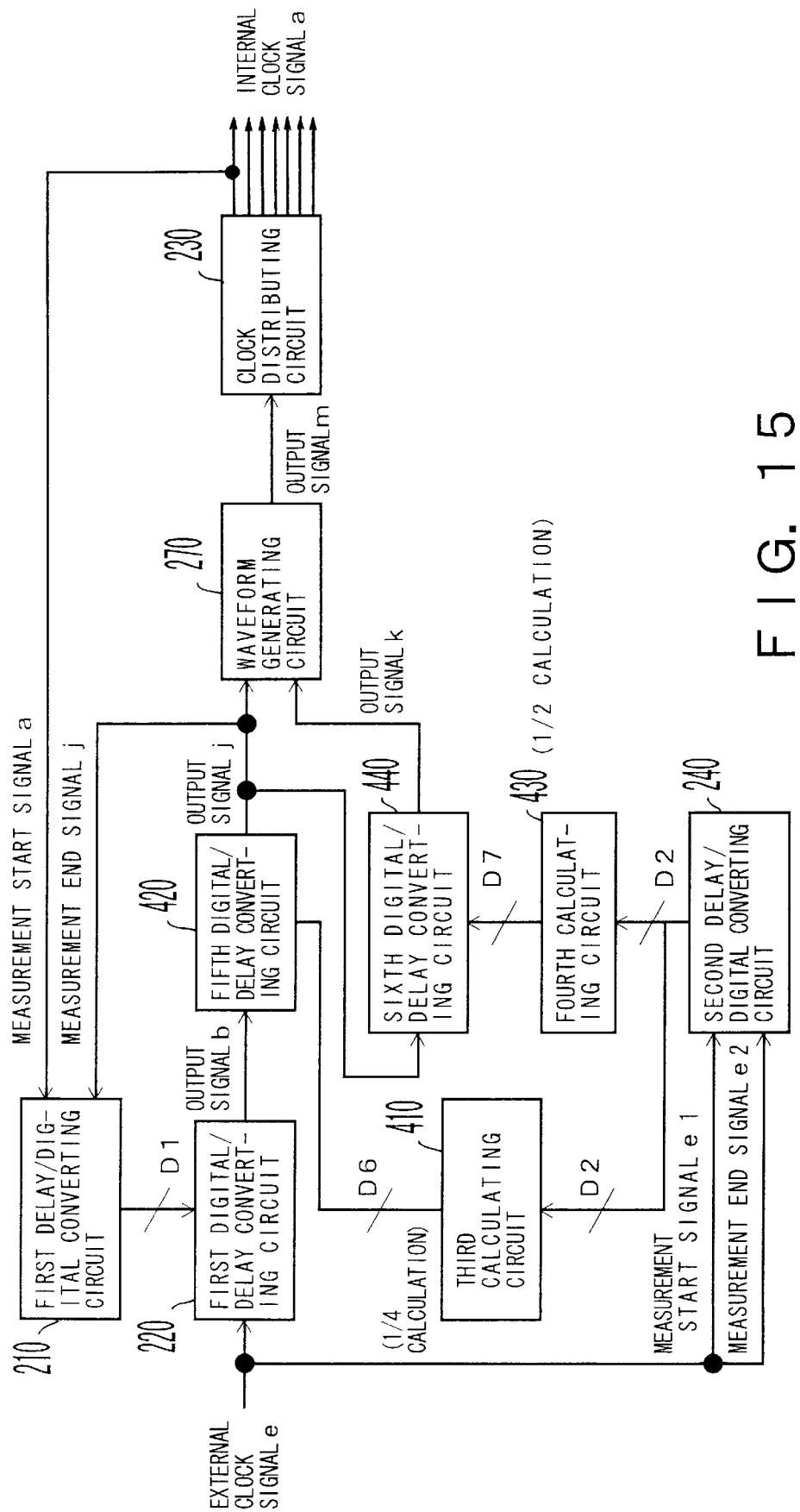
F I G. 15

PHASE COMPENSATING APPARATUS AND DELAY CONTROLLING CIRCUIT

BACKGROUND OF THE INVENTION

1. Field of the Invention

The present invention relates to a delay controlling circuit for delaying an input signal for a predetermined amount of time and a phase compensating apparatus for compensating the difference in phases of signals.

2. Description of the Related Art

As the processing speed of computer systems increases, the difference in phases of the internal clock and the system clock due to delays in clock distributing circuits in LSI devices becomes large. Thus, a phase compensating circuit for synchronizing the phase of the internal clock with the phase of the system clock is required.

As a phase compensating circuit, a PLL (phase locked loop) circuit is used. FIG. 1 is a block diagram showing a structure of a conventional PLL circuit having a voltage controlled oscillator. FIG. 2 is a block diagram showing a structure of a conventional PLL circuit having a voltage controlled delaying circuit.

In FIG. 1, a phase/frequency comparator 1 compares the phase of the internal clock signal with the phase of the external clock signal. A signal corresponding to the phase difference is supplied to a charge pump/low pass filter 2. The charge pump/low pass filter 2 supplies an analog control signal corresponding to the compared result of the phase/frequency comparator 1 to a voltage controlled oscillator 3. In addition, the charge pump/low pass filter 2 removes high frequency noise.

A voltage controlled oscillator 3 generates a clock signal with a frequency corresponding to the analog control signal that is received from the charge pump/low pass filter 2. The clock signal generated by the voltage controlled oscillator 3 is supplied by a clock distributing circuit 4 to each circuit portion of the LSI device as the internal clock signal. The internal clock signal is fed back to the phase/frequency comparator 1.

Next, the operation of the above-described PLL circuit will be described. When the phase (or frequency) of the external clock signal does not accord with the phase (or frequency) of the internal clock signal, an analog control signal corresponding to the phase difference between the clock signals is supplied to the voltage controlled oscillator 3. Thus, the oscillating frequency is controlled so that the phase difference decreases. A clock signal with a new frequency generated by the voltage controlled oscillator 3 is fed back to the phase/frequency comparator 1. These operations are repeated continuously. Thus, the oscillating frequency is controlled so that the phase of the external clock signal accords with the phase of the internal clock signal.

FIG. 2 is a block diagram showing a structure of a conventional PLL circuit having a voltage controlled delaying circuit 5 instead of the voltage controlled oscillator 3. The difference between the circuit shown in FIG. 2 and the circuit shown in FIG. 1 is in that the voltage controlled delaying circuit 5 designates an amount of delay for the external clock signal corresponding to the analog control signal received from the charge pump/low pass filter 2, and delays the external clock signal for the amount of delay time so that the phase of the internal clock signal accords with the phase of the external clock signal.

In PLL controlling circuits, the ratio of the change of the phase of the output signal to the detected phase difference is the loop gain. To decrease the lock time by which the phase difference value comes within a predetermined range, it is necessary to increase the loop gain. On the other hand, to improve the stability of the output signal, it is necessary to decrease the loop gain.

In the conventional analog controlled PLL circuit, a decrease in the lock time is in contradiction to the stability of the system. When the stability of the system is improved, the lock time increases. In contrast, when the lock time is decreased, the system becomes unstable.

In addition, when the above-described PLL controlling circuit is disposed in an LSI device, it is accomplished as an analog circuit using a CMOS process or the like. However, the characteristics of the charge pump and low pass filter as factors for obtaining the loop gain remarkably depend on the fabrication conditions of the LSI device. Thus, the stability of the system and the responsive characteristic thereof significantly vary corresponding to the fabrication conditions of the LSI device.

SUMMARY OF THE INVENTION

An object of the present invention is to provide a phase compensating apparatus with a short lock time and with high system stability.

The present invention is a phase compensating apparatus, comprising a delay time detecting circuit for subtracting a delay time period of an internal signal with a delay from an input signal from the cycle of the input signal, and outputting the resultant data as digital delay time data, and a phase difference compensation signal outputting circuit for delaying the input signal corresponding to the digital delay time data received from the delay time detecting circuit, so as to compensate for the phase difference between the input signal and the internal signal.

The delay time detecting circuit detects the difference between the delay in apparatus structural element disposed downstream of the phase difference compensation signal outputting circuit and the cycle of the input signal.

The phase difference compensating signal output circuit delays the input signal for the time difference between the cycle of the input signal and the internal signal.

Thus, a signal which is the output signal of the phase difference compensated signal output circuit has been delayed by the time delay of the structural elements downstream of the phase difference compensated signal output circuit is the internal signal.

Thus, since the internal signal has a delay which is same as the cycle of the input signal, the phase of the input signal accords with the phase of the internal signal.

These and other objects, features and advantages of the present invention will become more apparent in light of the following detailed description of best mode embodiments thereof, as illustrated in the accompanying drawings.

BRIEF DESCRIPTION OF THE DRAWINGS

FIG. 8 is a block diagram showing a structure of a phase compensating circuit according to a second embodiment of the present invention;

FIG. 15 is a block diagram showing a phase compensating circuit according to a fifth embodiment of the present invention.

DESCRIPTION OF THE PREFERRED EMBODIMENTS

Figure 1:
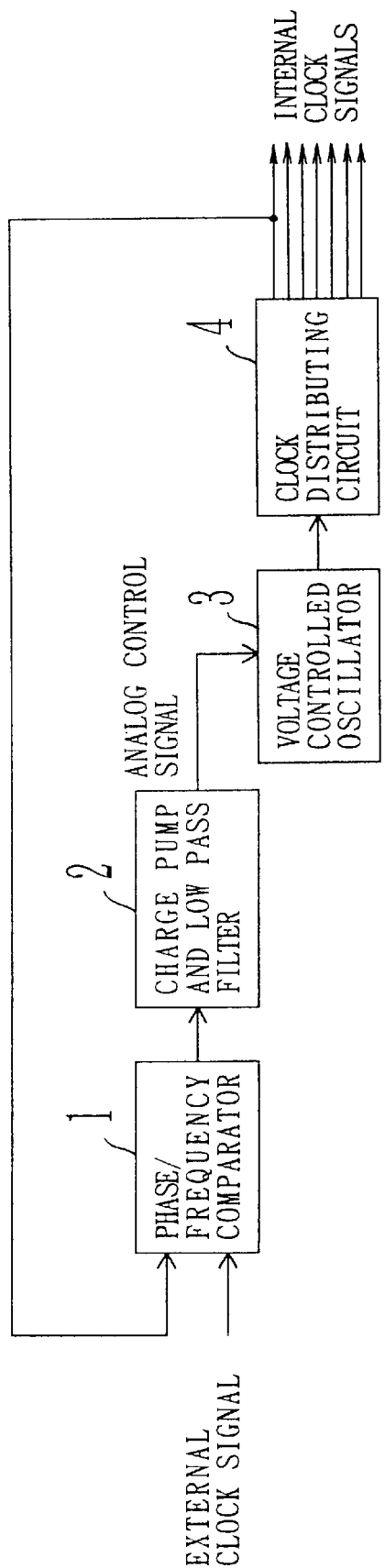
FIG. 1 is a block diagram showing a structure of a conventional PLL circuit.
Figure 2:
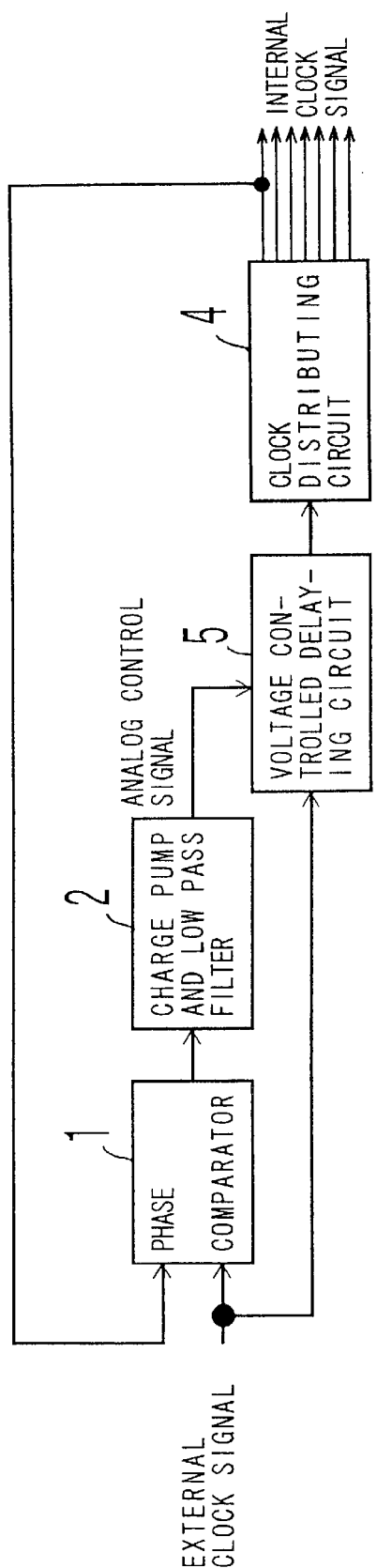
FIG. 2 is a block diagram showing a structure of a conventional PLL circuit.
Figure 3:
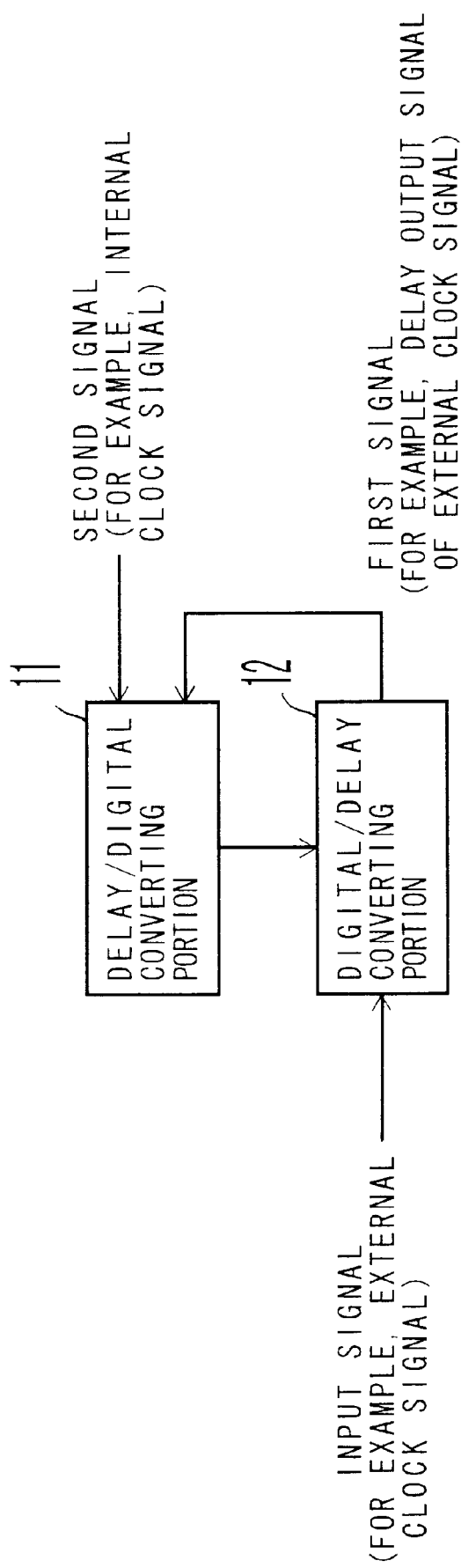
FIG. 3 is a schematic diagram showing the principle of a phase compensating apparatus according to the present invention.

FIG. 3 is a block diagram showing the principle of a phase compensating apparatus according to the present invention.

In FIG. 3, a delay/digital converting portion 11 outputs as digital delay time data the time period after the signal level of a second signal that has a delay against the first signal becomes "H" or "L" until the signal level of a first signal becomes "H" or "L".

In other words, the delay/digital converting portion 11 outputs as digital delay time data a value of which a delay time period "t cd" of the second signal is subtracted from a cycle "t cycle" of the input signal (t cycle−t cd) to a digital/delay converting portion 12.

The delay/digital converting portion 11 subtracts, for example, the delay time period "t cd" of the second signal from the cycle "t cycle" of the input signal, obtains (t cycle−t cd), and outputs as digital delay time data the calculated result. Alternatively, the delay/digital converting portion 11 directly obtains (t cycle−t cd) from the time period after the signal level of the second signal becomes "H" or "L" until the first signal becomes "H" or "L".

The digital/delay converting portion 12 outputs a signal which is the input signal that is delayed according to the delay time data. In other words, the digital/delay converting portion 12 outputs as the first signal the signal which is the input signal that is delayed for the delay time data (t cycle−t cd).

The input signal is, for example, an external clock signal supplied to an LSI device or the like. The second signal is, for example, an internal clock signal generated in the LSI device corresponding to the external clock signal. The first signal is a signal which is the external clock signal that is delayed according to the delay time data received from the delay/digital converting portion 11.

The delay/digital converting portion 11 outputs as the delay time data the time period after the signal level of the second signal (internal clock signal) becomes "H" or "L" until the signal level of the first signal becomes "H" or "L". The digital/delay converting portion 12 delays the input signal (external clock signal) according to the delay time data.

Alternatively, the delay/digital converting portion 11 obtains as the digital delay time data the time period after the signal level of a measurement start signal (for example, the internal clock signal) becomes "H" or "L" until the signal level of a measurement end signal (for example, the delayed output signal of the external clock signal) becomes "H" or "L" and delays the input signal (for example, the external clock signal) according to the delay time data. Thus, the value corresponding to the delay between the measurement start signal and the measurement end signal can be designated as the digital delay amount. Consequently, the phase compensating apparatus can be composed of only digital circuits.

Figure 4:
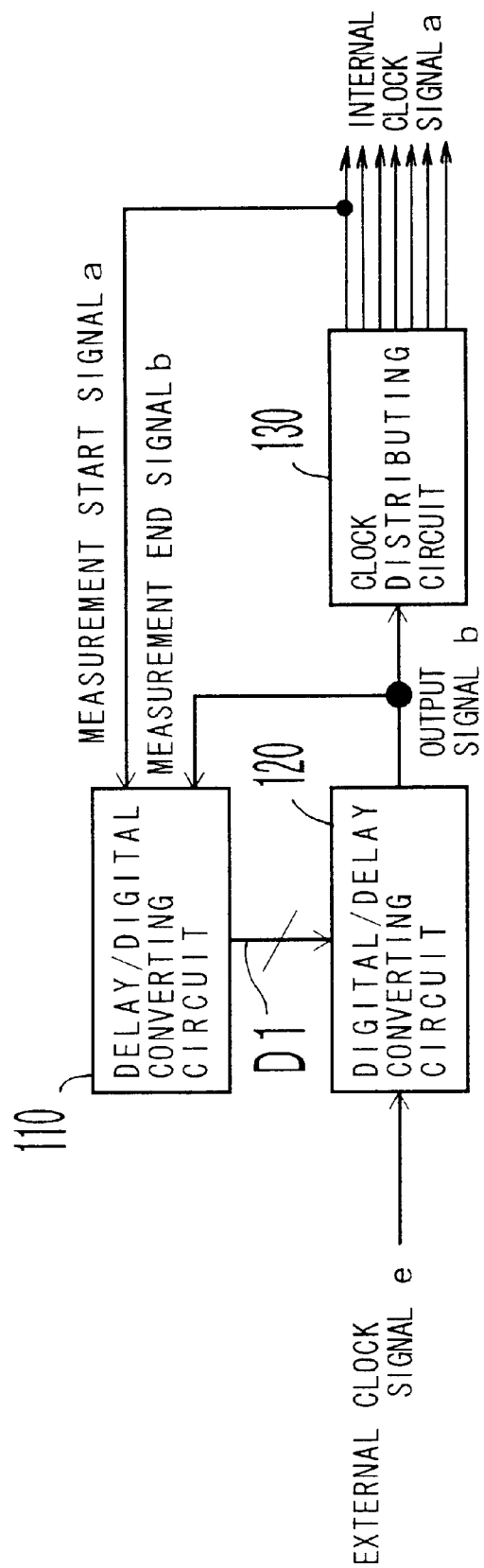
FIG. 4 is a block diagram showing a structure of a phase compensating apparatus according to a first embodiment of the present invention.

FIG. 4 is a block diagram showing a structure of a phase compensating apparatus according to the first embodiment of the present invention.

This phase compensating apparatus is used to compensate the phase of the internal clock signal of, for example, an LSI device with the phase of the external clock signal.

In FIG. 4, a delay/digital converting circuit 110 outputs as digital delay time data D1 the time period after the signal level of a measurement start signal (internal clock signal) a becomes "H" until the signal level of a measurement end signal b (an output signal b of a digital/delay converting circuit 120) becomes "H" to a digital/delay converting circuit 120.

The digital/delay converting circuit 120 outputs an output signal b of which the external clock signal e has been delayed for the delay time data D1 to a clock distributing circuit 130. The clock distributing circuit 130 supplies the internal clock signal a to each circuit portion of the LSI device. The clock distributing circuit 130 generates a predetermined amount of delay.

Figure 5:
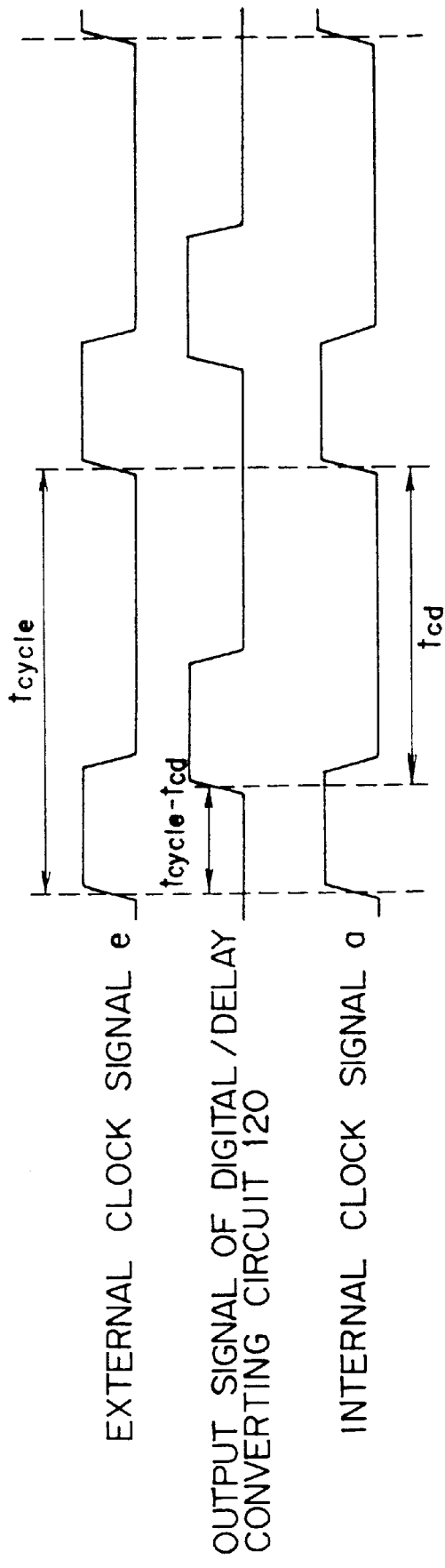
FIG. 5 is a time chart of the phase compensating apparatus according to the first embodiment.

Next, the operation of the circuit shown in FIG. 4 will be described with reference to a timing chart shown in FIG. 5.

Now, assuming that the cycle of the external clock signal e is denoted by "t cycle" and the delay of the clock distributing circuit 130 is denoted by "N t cycle+t cd" (where t cd<t cycle), the delay time period "t meas" between the internal clock signal a and the output signal b is measured by the delay/digital converting circuit 110 as follows (see FIG. 5).

$$t\ meas = (N+1)\ t\ cycle - (N\ t\ cycle + t\ cd) = t\ cycle - t\ cd \quad (1)$$

Since the delay time period "t meas" is output as the digital data D1 to the digital/delay converting circuit 120, the delay time period "t delay" of the digital/delay converting circuit 120 becomes "t delay=t meas". Thus, the total delay time period "t total" of the digital/delay converting circuit 120 and the clock distributing circuit 130 is expressed as follows.

$$t\ total = t\ means + (N\ t\ cycle + t\ cd) = (N+1)\ t\ cycle \quad (2)$$

The formula (2) represents that the total delay time period "t total" of the digital/delay converting circuit 120 and the clock distributing circuit 130 is a multiple of the cycle "t cycle" of the external clock signal e and thereby that the phase of the external clock signal e accords with the phase of the internal clock signal a.

In the first embodiment, when the delay of the clock distributing circuit 130 is "t cd", the delay time period of the output signal b of the digital/delay converting circuit 120 against the internal clock signal a is detected by a digital circuit. By delaying the external clock signal e for the delay time period, the internal clock signal a can be delayed against the external clock signal for one cycle. These circuits can be composed of only digital circuits without the need to use analog circuits such as a charge pump and a low pass filter. Thus, a phase compensating apparatus with a short lock time and with high system stability can be accomplished.

Next, with reference to FIGS. 6 and 7, structures of the delay/digital converting circuit 110 and the digital/delay converting circuit 120 will be described.

Figure 6:
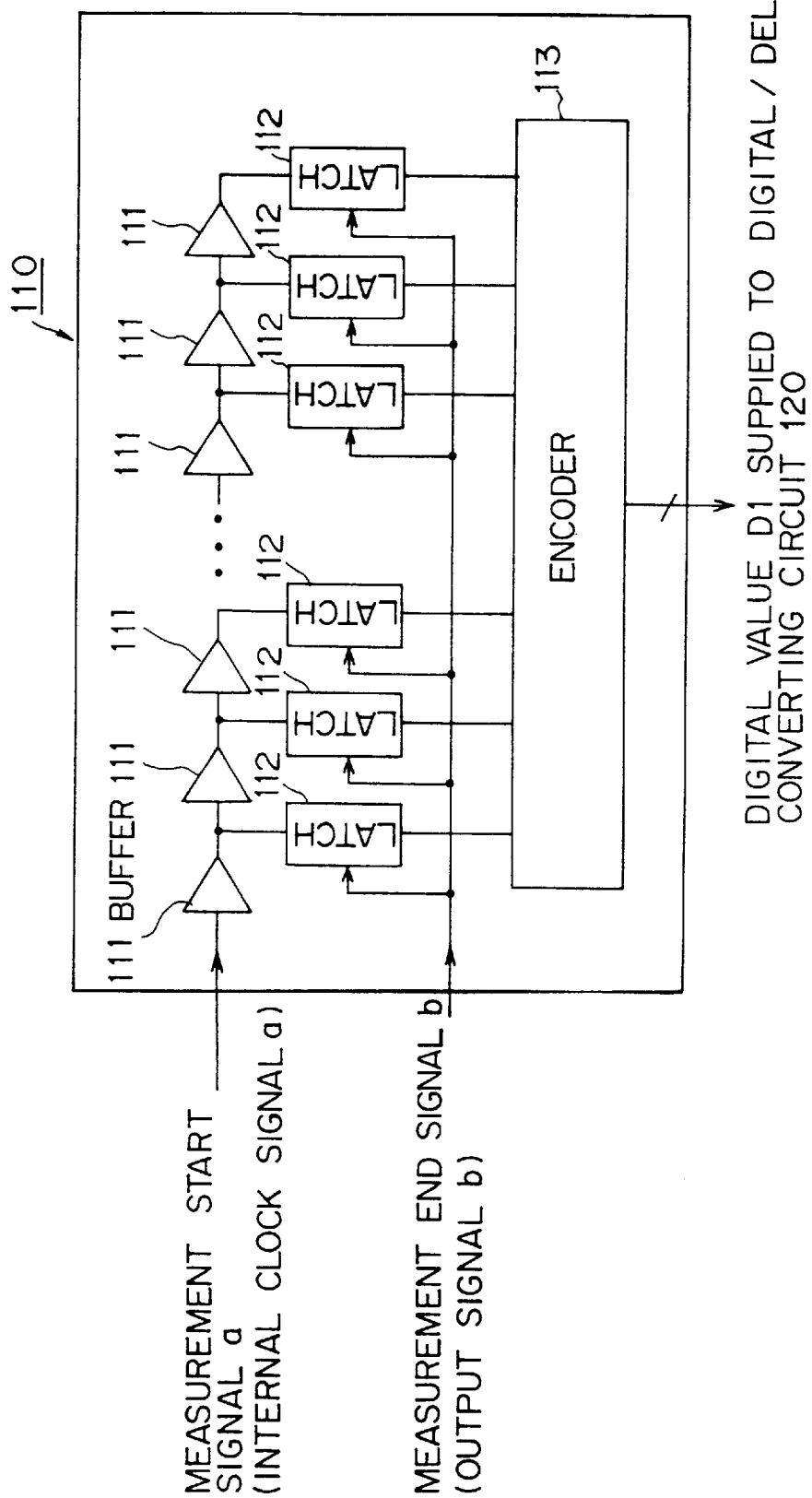
FIG. 6 is a block diagram showing a structure of a delay/digital converting circuit.

Referring to FIG. 6, the delay/digital converting circuit 110 comprises a plurality of buffers 111, a plurality of latch circuits 112, and an encoder (converting circuit) 113. The buffers 111 are connected in series. The latch circuits 112 latch the output signals of the buffers 111. The encoder 113 is connected to the output terminals of the latch circuits 112. The encoder 113 outputs digital data D1 corresponding to a combination of data of the input terminals of the encoder 113.

The encoder 113 may be composed of a plurality of exclusive OR gates (detecting circuits) that exclusive-OR output signals from associated latch circuits 112 so as to detect the change points of output signals that vary from "1" to "0", and output digital data corresponding to the change points of the signals. Thus, the encoder 113 can output the digital data D1 corresponding to the amount of delay time of the buffers 111.

The measurement start signal (internal clock signal) a is input to the first buffer 111. When the signal level of the internal clock signal a becomes "1", an output signal with a signal level of "1" is output to the second buffer 111. Each of the latch circuits 112 latches the output signal of the relevant buffer 111 in synchronization with the measurement end signal b (the output signal b of the digital/delay converting circuit 120).

Figure 7:
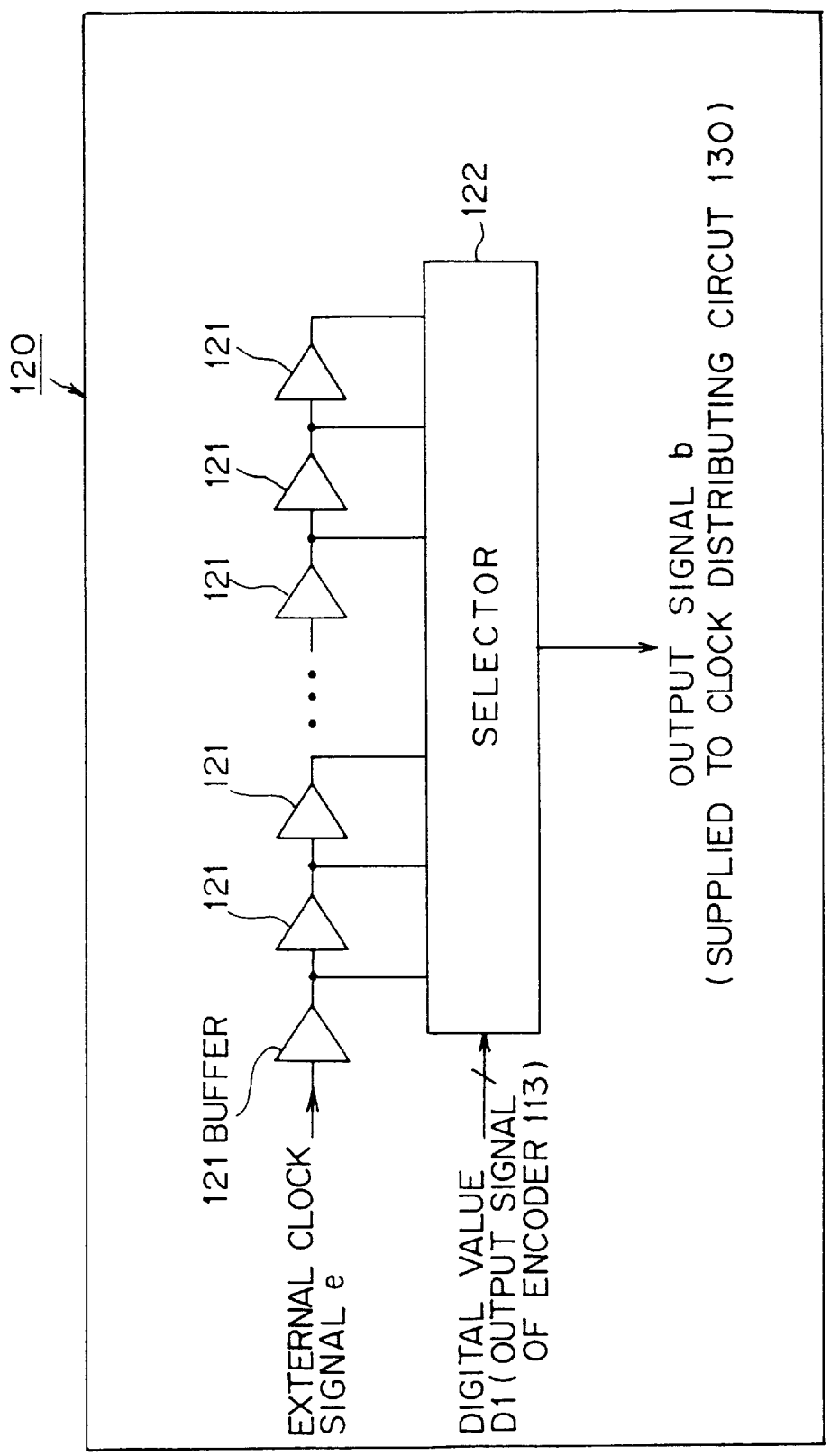
FIG. 7 is a block diagram showing a structure of a digital/delay converting circuit.

Referring to FIG. 7, a digital/delay converting circuit 120 comprises a plurality of buffers 121 and a selector (selecting circuit) 122. The buffers 121 are connected in series. The selector 122 outputs one of signals received from plural input terminals corresponding to digital data D1 (an output signal of the encoder 113). An external clock signal e is input to a first buffer 121. An output signal of the selector 122 is output as an output signal b to a clock distributing circuit 130.

Now assume that the delay of one buffer 111 in the delay/digital converting circuit 110 shown in FIG. is denoted by Δt. In addition, assume that the signal level of the measurement end signal b becomes "1" at an n Δt time period after the signal level of the measurement start signal a becomes "1". In this case, when the signal level of the measurement end signal b becomes "1", the signal levels of the output signals of the n buffers 111 of the delay/digital converting circuit 110 are "1" and the signals are latched by the n latch circuits 112. Digital data corresponding to the output signal of the n-th latch circuit 112 is output as the digital delay time data D1 from the encoder 113.

In other words, the encoder 113 outputs the digital delay time data D1 for the phase difference between the internal clock signal a and the output signal b of the digital/delay converting circuit 120 from the encoder 113.

On the other hand, the delay time period of each buffer 121 of the digital/delay converting circuit 120 shown in FIG. 7 is the same as the delay time period of the buffer 111 shown in FIG. 6. Thus, each buffer 121 delays the relevant input signal for a Δt time period. The n-th buffer 121 delays the relevant input signal for an n Δt time period.

Since the selector 122 inputs the delay time data D1 measured by the delay/digital converting circuit 110, the selector 122 selects and outputs the external clock signal e corresponding to the delay time data D1.

When the delay measured by the delay/digital converting circuit 110 is n Δt, the output signal of the n-th buffer 121, delayed for an n Δt time period, is supplied to the clock distributing circuit 130.

In other words, the digital/delay converting circuit 120 outputs a signal with a time delay corresponding to the phase difference between the internal clock signal a and the output signal b of the digital/delay converting circuit 120. Thus, the total delay, including the delay of the clock distributing circuit 130, can be designated as a multiple of the cycle of the external clock signal. Consequently, the phase of the internal clock signal a can be matched with the phase of the external clock signal e.

FIG. 8 is a circuit diagram showing a phase compensating apparatus according to a second embodiment of the present invention.

The phase compensating apparatus according to the second embodiment comprises a calculating circuit 160. The calculating circuit 160 performs a predetermined calculation for a digital delay time output signal D1 of a delay/digital converting circuit 150. An output signal d that is delayed for a digital delay time output signal D2 as the calculation result of the calculating circuit 160 is output from the digital/delay converting circuit 170.

In the phase compensating apparatus according to the second embodiment, for example, an input signal that has been delayed for a (t cycle–t cd) time period, is supplied to a clock distributing circuit (not shown) that delays a signal for "t cd". Thus, the delay of the measurement start signal a from the input signal c becomes a multiple of the cycle "t cycle". Consequently, with only digital circuits, the phase of the input signal c can be matched with the phase of the measurement start signal a in a short time.

Moreover, in the phase compensating apparatus according to the second embodiment, the measurement end signal b and the measurement start signal a have the same cycle "t cycle" as the input signal c. When the measurement start signal a is delayed for "t cd" against the measurement end signal b, the delay after the signal level of the measurement start signal a becomes "H" until the signal level of the measurement end signal b becomes "H", is obtained as the delay time data. Thus, the value (t cycle–t cd) of which the delay "t cd" of the measurement start signal a is subtracted from the cycle "t cycle", can be directly obtained. When the input signal c is delayed for the delay time data, the delay of the measurement start signal a against the input signal c becomes a multiple of the cycle "t cycle".

Thus, the phase of the measurement start signal a can be matched with the phase of the input signal c.

Consequently, since the phase compensating apparatus according to the second embodiment can be composed of only digital circuits, without the need to use analog circuits such as a charge pump and a low pass filter, a phase compensating apparatus with a short lock time and with high system stability can be accomplished. In addition, since any desired calculation can be performed for the digital delay time data that is output from the delay/digital converting circuit 150, a signal delayed for a desired time period against an input signal or a signal with a 1/n cycle of an input signal can be generated.

Next, the phase compensating apparatus according to the second embodiment will be described in detail.

In FIG. 8, the delay/digital converting circuit 150 converts delays of two input signals (measurement start signal a and measurement end signal b) into digital delay time data D1 and outputs the converted delay time data D1 to a calculating circuit 160.

The measurement end signal b is a feed-back signal of an output signal d, which is an input signal (for example, the external clock signal) that is delayed by the digital/delay converting circuit 170. The measurement start signal a is a signal which is the output signal d that is delayed in the LSI device (the signal a is, for example, the internal clock signal).

The calculating circuit 160 directly outputs the input delay time data D1 to the digital/delay converting circuit 170. Alternatively, the calculating circuit 160 outputs a delay time data D2 which is the delay time data D1 that has been calculated according to a desired calculation to the digital/delay converting circuit 170. The digital/delay converting circuit 170 outputs an output signal d which is the input signal c that has been delayed according to the delay time data D2.

Now assume that the delay time period after the signal level of the measurement start signal a becomes "H" (or "L"), until the signal level of the measurement end signal b becomes "H" (or "L"), is denoted by "t meas", the measurement resolution of the delay/digital converting circuit 150 is denoted by $\Delta t_1$, the measurement error is denoted by $\delta t$, and the delay time data that is output from the delay/digital converting circuit 150 is denoted by D1.

The relation between the delay time data D1 that is output from the delay/digital converting circuit 150 and the delay time period between the measurement start signal a and the measurement end signal b is expressed as follows.

$$D1=(t\ meas-\delta t)/\Delta t1 \tag{3}$$

In addition, assume that the delay time data that is input to the digital/delay converting circuit 170 is denoted by D2, the delay of the digital/delay converting circuit 170 is denoted by "t delay", and the resolution of the digital/delay converting circuit 170 is denoted by $\Delta t_2$. At this point, the relation between the delay time data D2 and the delay "t delay" of the output signal d from the input signal c can be expressed as follows.

$$t\ delay=D2\cdot\Delta t_2 \tag{4}$$

When the calculating circuit 160 performs a particular calculation, the relation between the delay time data D1 and D2 can be expressed as follows.

$$D2=F(D1) \tag{5}$$

where "F" is a proportional function that depends on the calculating circuit 160.

From the formulas (3) to (5), the relation between the delay time period "t meas" of the measurement end signal b against the measurement start signal a and the delay time "t delay" of the output signal d against the input signal c can be expressed as follows.

$$t\ delay=F([t\ meas-\delta t]/\Delta t_1)\Delta t_2 \tag{6}$$

When "t meas">>$\Delta t_1$ and "t delay">>$\Delta t_2$, the formula (6) can be approximated to the following formulas.

$$t\ delay=F(t\ meas\cdot\Delta t_2/\Delta t_1) \tag{7}$$

In addition, when the resolution $\Delta t_1$ of the delay/digital converting circuit 150 is equal to the resolution $\Delta t2$ of the digital/delay converting circuit 170, the formula (7) can be expressed as follows.

$$t\ delay=F(t\ meas) \tag{8}$$

Thus, the delay of the measurement end signal b against the measurement start signal a measured by the delay/digital converting circuit 150 and the delay designated by the calculating circuit 160 can be generated by the digital/delay converting circuit 170.

Figure 9A:
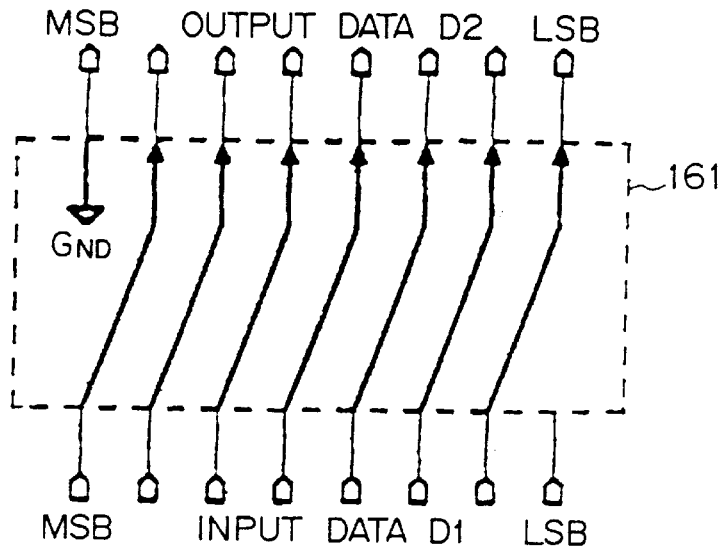
FIG. 9A is a schematic diagram showing an example of a 1/2 calculating circuit.
Figure 9B:
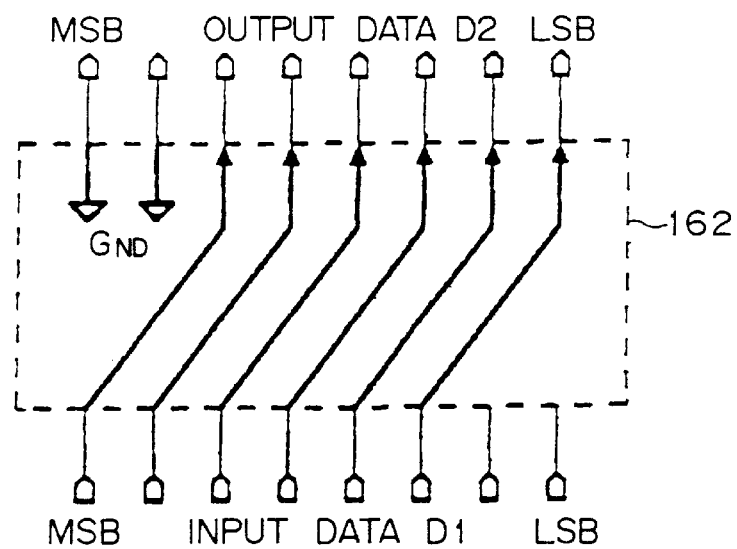
FIG. 9B is a schematic diagram showing an example of a 1/4 calculating circuit.

FIGS. 9A and 9B are schematic diagrams showing examples of calculating circuit 160 of the phase compensating apparatus shown in FIG. 9B. FIG. 9A shows a 1/2 calculating circuit 161. FIG. 9B shows a 1/4 calculating circuit 162. Each of the 1/2 calculating circuit 161 and the 1/4 calculating circuit 162 may be composed of a calculating circuit 160 that has a switching mechanism or the like.

The 1/2 calculating circuit 161 and the 1/4 calculating circuit 162 shown in FIGS. 9A and 9B input and output 8-bit digital data. In FIGS. 9A and 9B, MSB represents the most significant bit, whereas LSB represents the least significant bit.

As shown in FIG. 9A, the 1/2 calculating circuit 161 shifts each bit of the input data D1 by one bit to the LSB and outputs the output data D2.

On the other hand, as shown in FIG. 9B, the 1/4 calculating circuit 162 shifts each bit of the input data D1 by two bits to the LSB and outputs the output data D2.

Figure 10:
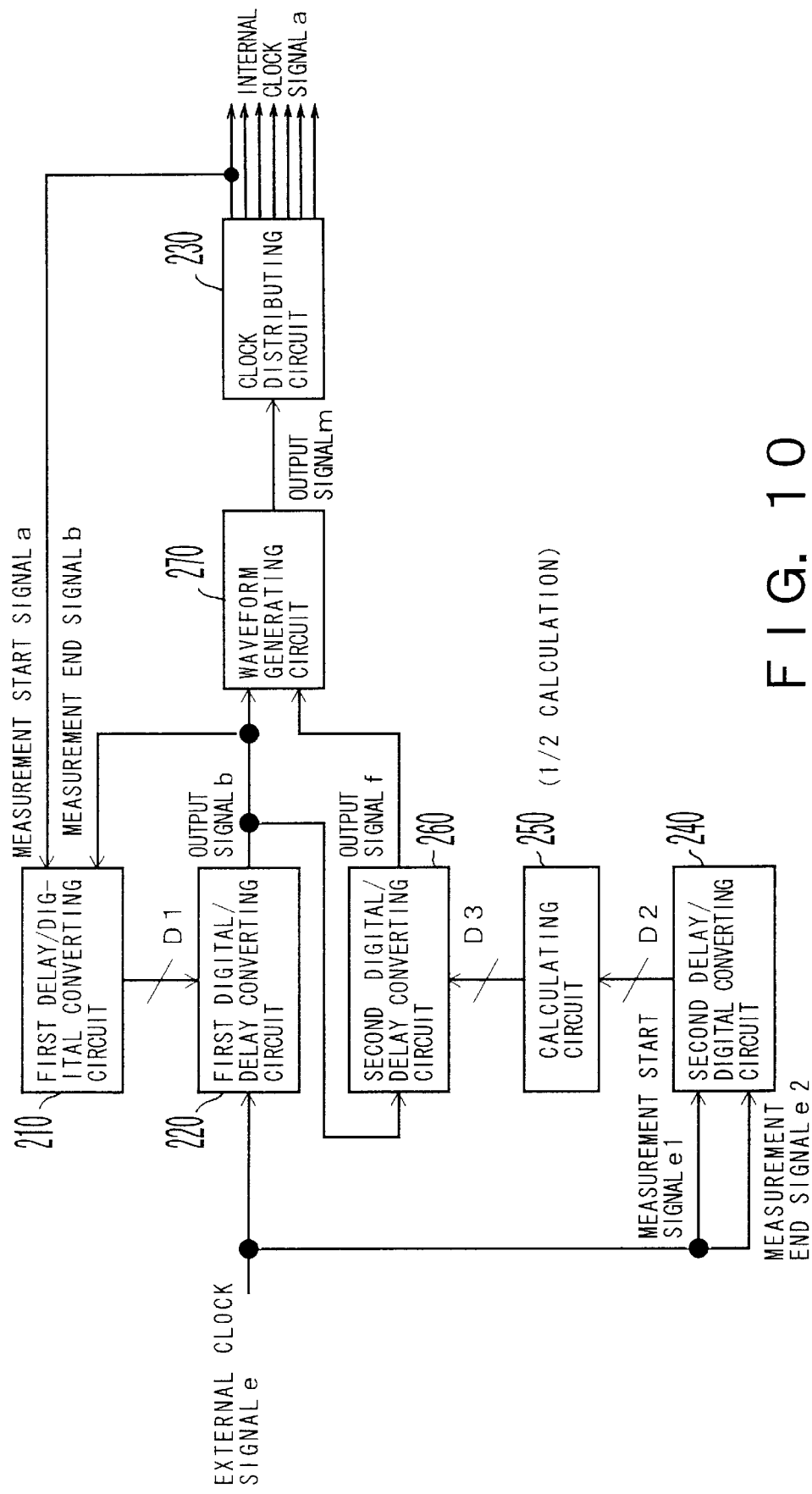
FIG. 10 is a block diagram showing a phase compensating circuit according to a third embodiment of the present invention.

FIG. 10 is a block diagram showing a structure of a phase compensating apparatus according to a third embodiment of the present invention.

Referring to FIG. 10, the phase compensating apparatus according to the third embodiment changes a calculation for the cycle of an external clock signal e in the calculating circuit 250 (for example, a 1/2 cycle or a 1/4 cycle calculating circuit). Thus, the duty ratio of the internal clock signal can be freely designated.

In FIG. 10, the operation of a structure composed of a first delay/digital converting circuit 210, a first digital/delay converting circuit 220, and a clock distributing circuit 230 is the same as the operation of a structure composed of the delay/digital converting circuit 110, the digital/delay converting circuit 120, and the clock distributing circuit 130 shown in FIG. 4. In addition, the structures of the first delay/digital converting circuit 210 and the second delay/digital converting circuit 240 are the same as the delay/digital converting circuit 110 shown in FIG. 6. Likewise, the structures of the first digital/delay converting circuit 220 and the second digital/delay converting circuit 260 are the same as digital/delay converting circuit 120 shown in FIG. 7.

The structure of the n-th delay/digital converting circuit (where n is an integer) according to the above-described third embodiment, a fourth embodiment, and a fifth embodiment (which will be described later) is the same as the structure of the delay/digital converting circuit 110 shown in FIG. 6. Likewise, the structure of the n-th digital/delay converting circuit (where n is an integer) according to these embodiments is the same as the structure of the digital/delay converting circuit 120 shown in FIG. 7.

In FIG. 10, the second delay/digital converting circuit 240 has as inputs an external clock signal e as a measurement start signal e1 and a measurement end signal e2, and measures the cycle of the external clock signal e. The measured time period of one cycle is output as digital data D2 to the calculating circuit 250. In other words, the second delay/digital converting circuit 240 measures the time period after the signal level of the external clock signal e becomes "H" until the next signal becomes "H" and supplies the measured time period as the digital delay time data D2 to the calculating circuit 250.

The calculating circuit 250 performs a desired digital calculation for the digital delay time data D2 and outputs the resultant data to the second digital/delay converting circuit 260. In this embodiment, the calculating circuit 250 is described as the 1/2 calculating circuit 161 shown in FIG. 9A. However, it should be noted that the calculating circuit 250 may also be the above-described 1/4 calculating circuit 162.

The calculating circuit 250 decreases the cycle "t cycle" of the external clock signal e to 1/2 and outputs the resultant data as a digital output signal D3 to the second digital/delay converting circuit 260.

The second digital/delay converting circuit 260 delays an output signal b from the first digital/delay converting circuit 220 for the delay time data D3 received from the calculating circuit 250 and supplies the resultant data as an output signal f to a waveform generating circuit 270.

The waveform generating circuit 270 generates an output signal m. The signal level of the output signal m becomes "H" as the signal level of an output signal b from the first digital/delay converting circuit 220 becomes "H". In addition, the signal level of the output signal m becomes "L" as the signal level of an output signal f from the second digital/delay converting circuit 260 becomes "H". The signal generated by the waveform generating circuit 270 is output as the output signal m to the above-described clock distributing circuit 230 and distributed as an internal clock signal a to each circuit portion of the apparatus.

Figure 11:
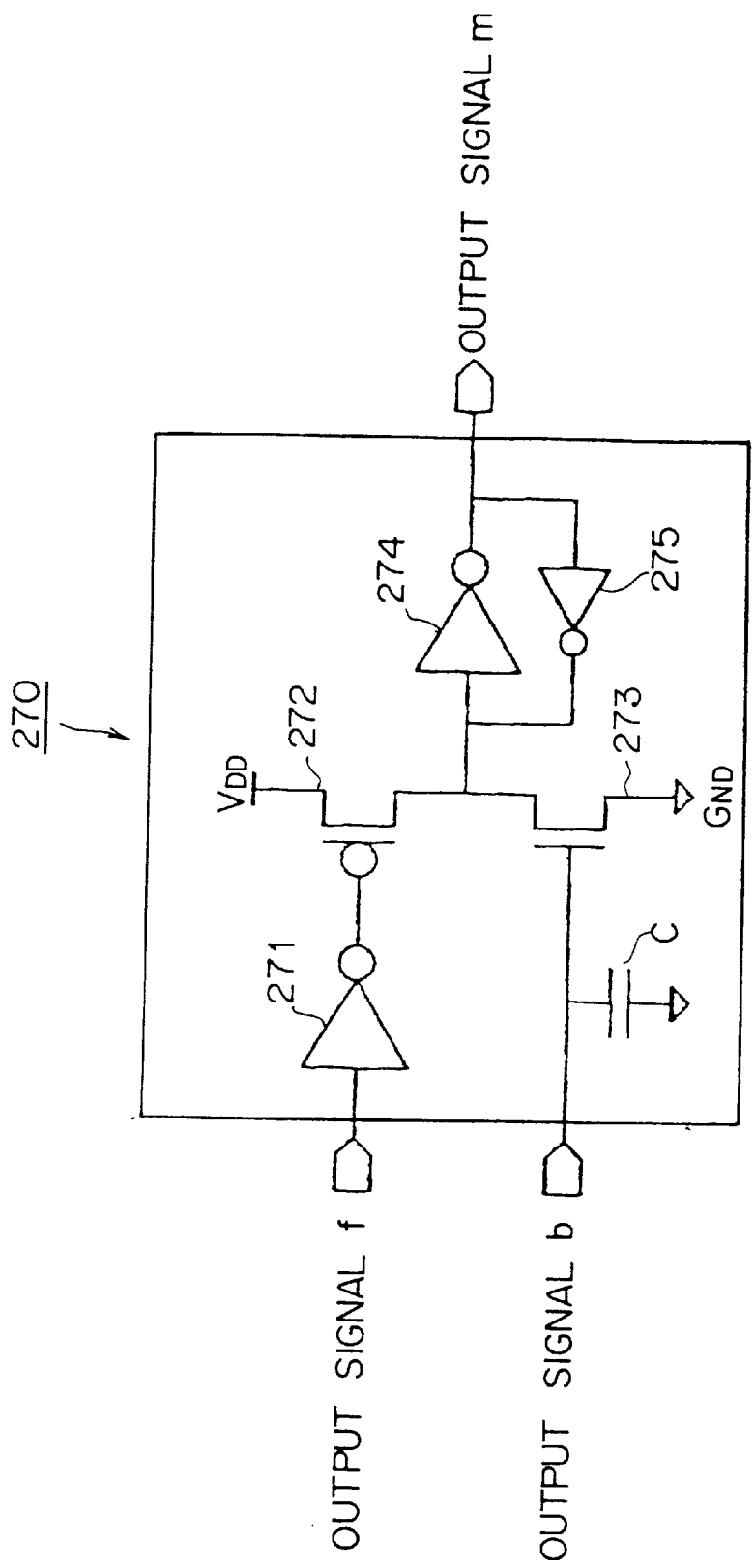
FIG. 11 is a circuit diagram showing a waveform generating circuit.

FIG. 11 is a circuit diagram showing a structure of the waveform generating circuit 270.

In FIG. 11, the waveform generating circuit 270 comprises inverters 271, 274, and 275, field effect transistors (FET) 272, and 273, and a condenser C. When the signal level of the gate input voltage of the FET 272 becomes "L", the FET 272 is turned on. When the signal level of the gate input voltage of the FET 273 becomes "H", the FET 273 is turned on.

By adjusting the capacitance of the condenser C, the delay after the signal level of the output signal b becomes "H" until the signal level of the output signal m varies, accords with the delay after the signal level of the output signal f becomes "H" until the signal level of the output signal m varies.

When the output signal b received from the first digital/delay converting circuit 220 becomes "H" and is supplied to the FET 273, the FET 273 is turned on. Thus, the input terminal of the inverter 274 is grounded. Consequently, since the signal level of the inverted output signal of the inverter 274 becomes "H", the signal level of the output signal m becomes "H". The output signal of the inverter 274 is inverted by the inverter 275 and fed back to the input terminal of the inverter 274. Thus, even when the signal level of the output signal b becomes "L", the signal level of the output signal m is kept "H".

Thereafter, when the signal level of the output signal f of the second digital/delay converting circuit 260 becomes "H", the signal level of the inverted output signal of the inverter 271 becomes "L" and the signal is supplied to the gate of the FET 272. Thus, the FET 272 is turned on and a voltage Vdd is supplied to the input terminal of the inverter 274. Consequently, the signal level of the output signal m becomes "L".

In other words, the waveform generating circuit 270 operates so that the signal level of the output signal m becomes "H" as the signal level of the output signal b becomes "H", and that the signal level of the output signal m becomes "L" as the signal level of the output signal f becomes "H".

Since the output signal f is a signal which is the output signal b that has been delayed according to the delay time data D3 received from the calculating circuit 250, the signal levels of the output signals b and f do not become "H" at the same time. In the period after the signal level of the output signal b becomes "H" until the signal level of the output signal f becomes "H", the signal level of the output signal m is kept "H" (even while the signal levels of the both output signals are "L").

Next, the operation of the circuit shown in FIG. 10 will be described with reference to a timing chart shown in FIG. 12. As described above, the first digital/delay converting circuit 220 outputs a signal which is the external clock signal e of the next cycle that has been delayed according to the phase difference (t cycle–t cd) between the output signal b and the internal clock signal a (namely, the output signal b of the next cycle of the first digital/delay converting circuit 220).

Figure 12:
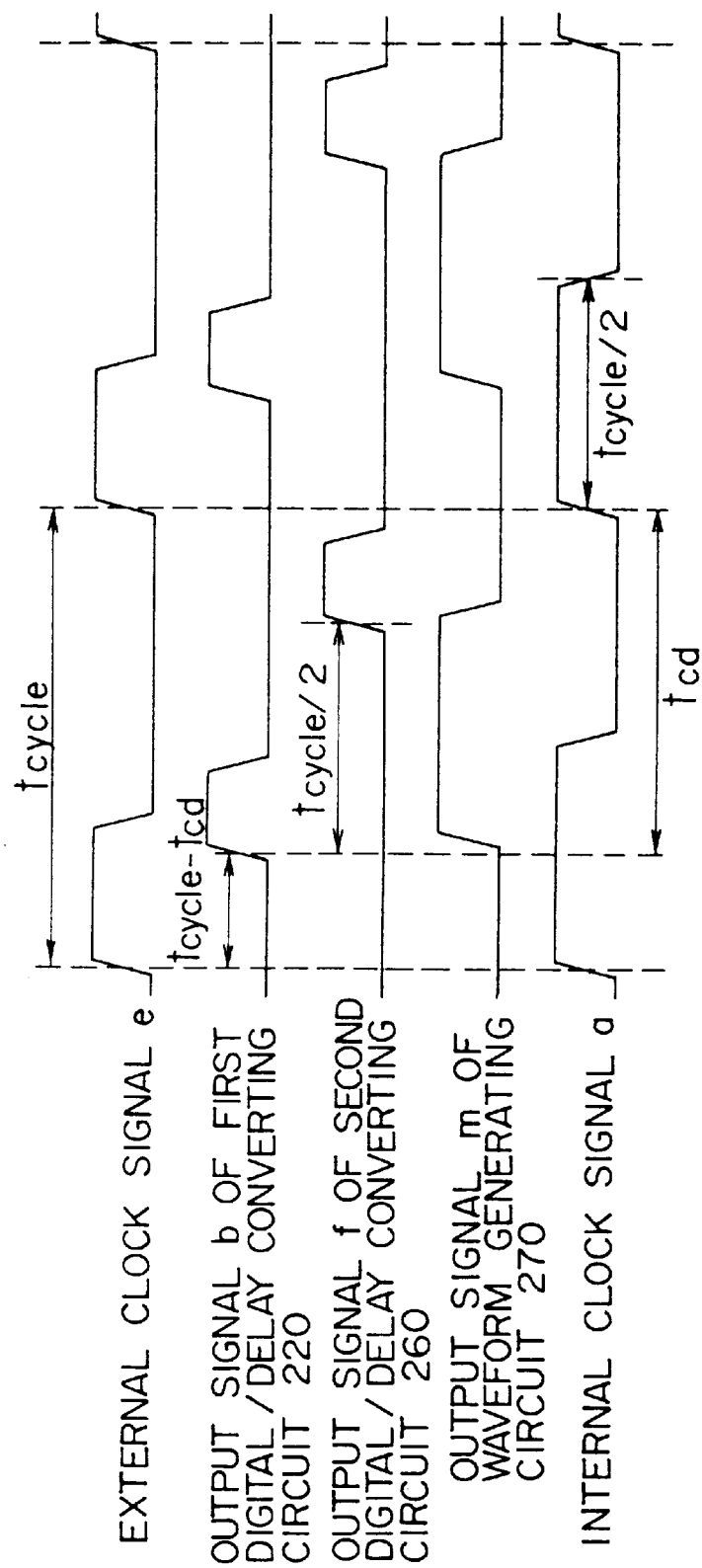
FIG. 12 is a timing chart of the phase compensating circuit according to the third embodiment.

When the calculating circuit 250 performs a calculation for decreasing the input data to 1/2, as shown in FIG. 12, the second digital/delay converting circuit 260 outputs an output signal f which is the output signal b of the first digital/delay converting circuit 220 that has been delayed for half the period of the external clock signal.

Thus, as shown in FIG. 12, the waveform generating circuit 270 outputs the output signal m. The signal level of the output signal m becomes "H" as the signal level of the output signal b that has been delayed for the (t cycle–t cd) time period against the external clock signal e becomes "H". The signal level of the output signal m becomes "L" as the output signal f which is the output signal b that has been delayed for 1/2 period of the external clock signal e becomes "L".

In this case, since the calculating circuit 250 performs a calculation for decreasing the cycle "t cycle" of the external clock e to 1/2, the signal level of the output signal of the waveform generating circuit 270 becomes "L" after the half cycle of the external clock signal elapses. Thus, the duty ratio of the output signal of the waveform generating circuit 270 becomes 50%.

The clock distributing circuit 230 delays the output signal of the waveform generating circuit 270 for the "t cd" time period (t cycle–t cd+t cd) (namely, a signal that has been delayed for one cycle "t cycle" of the external clock signal e is output as the internal clock signal a). Thus, the phase of the external clock signal e accords with the phase of the internal clock signal a.

Figure 13:
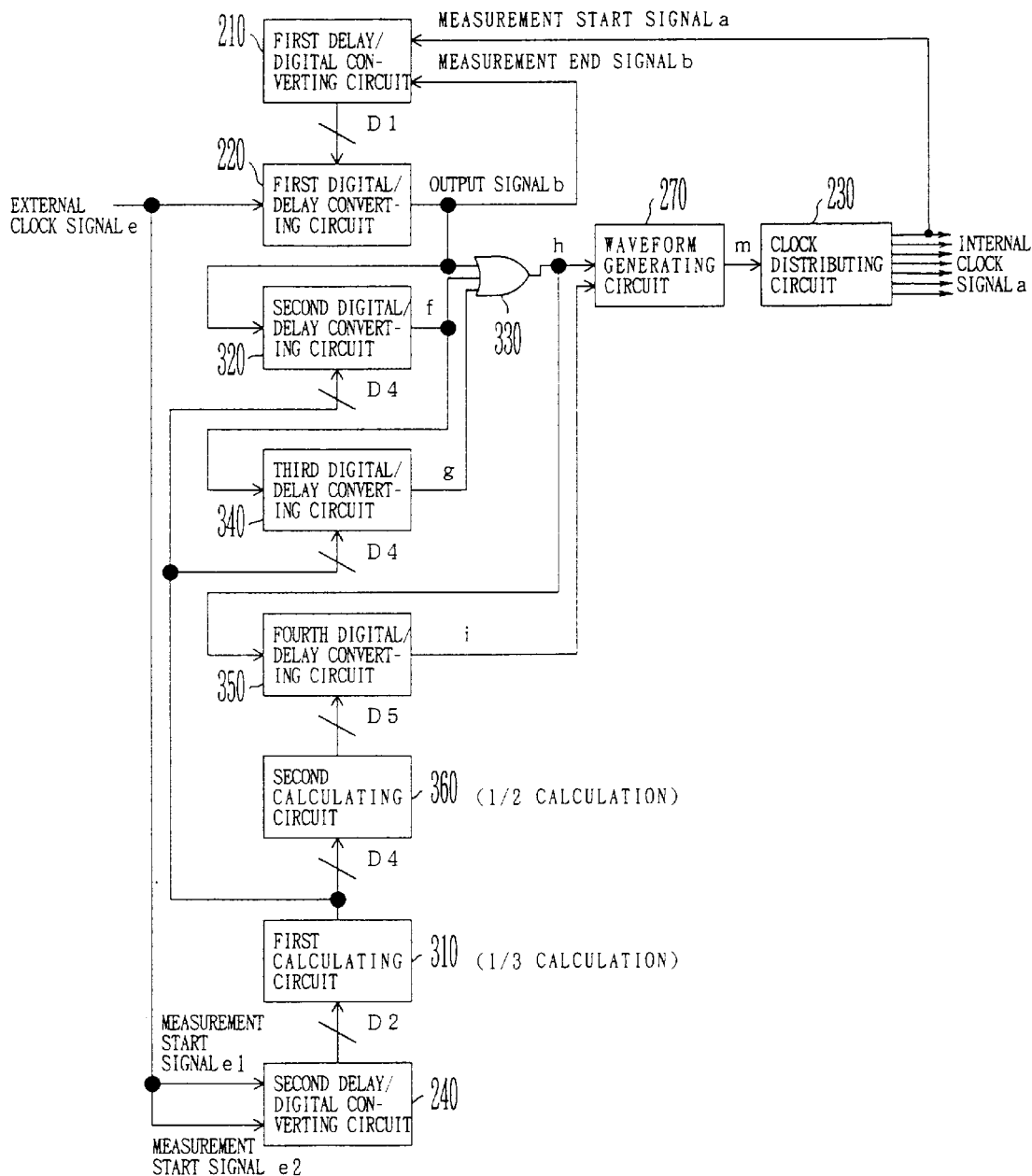
FIG. 13 is a block diagram showing a structure of the phase compensating circuit according to a fourth embodiment of the present invention.

FIG. 13 is a block diagram showing a structure of a phase compensating apparatus according to a lfourth embodiment of the present invention.

In the fourth embodiment, an output signal with a frequency that is a multiple of the frequency of an input signal and with a desired duty ratio is generated.

In the circuit according to the fourth embodiment shown in FIG. 13, portions similar to those according to the third embodiment shown in FIG. 10 are denoted by similar reference numerals and the description thereof is omitted.

Next, only portions that are different from those in the third embodiment will be described.

A first calculating circuit 310 operates in the same manner as the calculating circuit 250 according to the third embodiment. The first calculating circuit 310 performs a calculation for decreasing the period of one cycle measured by a second delay/digital converting circuit 240 to 1/n. In the fourth embodiment, the first calculating circuit 310 performs a calculation for decreasing the cycle "t cycle" of the external clock signal to 1/3.

A second digital/delay converting circuit 320 delays an output signal b from the first digital/delay converting circuit 220 for digital data D4 received from the first calculating circuit 310 (1/3 of the cycle "t cycle" of the external clock signal in this embodiment) and supplies the resultant signal as a signal f to a three-input OR gate 330.

A third digital/delay converting circuit 340 delays the output signal f of the second digital/delay converting circuit 320 for digital data D4 received from the first calculating circuit 310, and supplies the resultant signal as a signal g to the three-input OR gate 330.

A second calculating circuit 360 decreases the input data to 1/n so as to designate the duty ratio of a clock signal generated by a waveform generating circuit 270. In this embodiment, the cycle "t cycle" of the external clock signal that has been decreased to 1/3 by the calculating circuit 310 is decreased to 1/2. Thus, the delay of an output signal h of the three-input OR gate 330 becomes "t cycle /6". Consequently, the duty ratio of the clock signal generated by the waveform generating circuit 270 becomes 50%.

A fourth digital/delay converting circuit 350 receives the output signal h of the three-input OR gate 330, delays the output signal h for digital output data D5 of the second calculating circuit 360, and supplies the resultant signal as a signal i to the waveform generating circuit 270.

The waveform generating circuit 270 generates an output signal m. The signal level of the output signal m becomes "H" as the signal level of the output signal h of the three-input OR gate 330 becomes "H". The signal level of the output signal m becomes "L" as the output signal i of the fourth digital/delay converting circuit 350 becomes "H".

Figure 14:
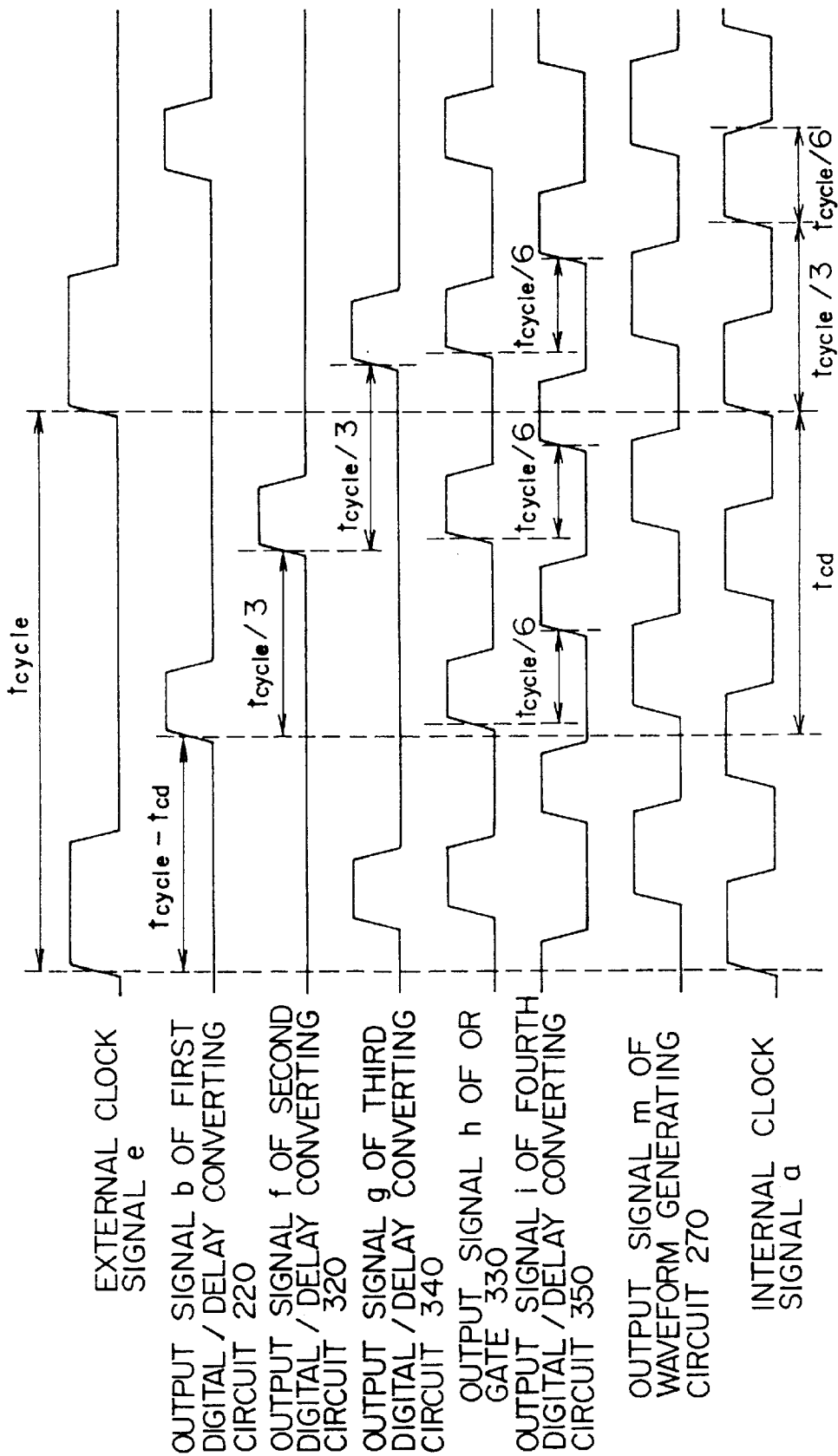
FIG. 14 is a timing chart of the phase compensating circuit according to the fourth embodiment.

Next, with reference to a timing chart shown in FIG. 14, the operation of the circuit shown in FIG. 13 will be described. As described above, the first digital/delay converting circuit 220 outputs an output signal b that has been delayed for the(t cycle−t cd) time period from the external clock signal e. The second digital/delay converting circuit 320 outputs the output signal f which is the output signal b of the first digital/delay converting circuit 220 that has been delayed for 1/3 of one cycle "t cycle" of the external clock signal e.

The third digital/delay converting circuit 340 outputs the output signal g which is the output signal f of the second digital/delay converting circuit 320 that has been delayed for "t cycle /3".

When the period in which the values of the output signals of the first digital/delay converting circuit 220, the second digital/delay converting circuit 320, and the third digital/delay converting circuit 340 are "1" is shorter than 1/3 of the cycle "t cycle" of the external clock signal e, the signal level of the output signal b of the first digital/delay converting circuit 220 becomes "H" in the period of one cycle "t cycle" of the external clock signal e. With a delay of "t cycle/3" from the output signal b, the signal level of the output signal f of the second digital/delay converting circuit 320 becomes "H". With a delay of "t cycle/3" from the output signal f, the signal level of the output signal g of the third digital/delay converting circuit 340 becomes "H".

The three-input OR gate 330 ORs output signals b, f, and g of the first digital/delay converting circuit 220, the second digital/delay converting circuit 320, and the third digital/delay converting circuit 340. Thus, the signal level of the output signal h of the three-input OR gate 340 switches between "H" and "L" three times in the period of one cycle "t cycle" of the external clock signal e. In other words, the output signal of the three-OR gate 330 becomes a signal with a frequency three times higher than the frequency of the external clock signal.

The fourth digital/delay converting circuit 350 outputs the output signal i that has delayed for "t cycle/6" against the output signal h of the three-input OR gate 330.

In other words, the output signal i of the fourth digital/delay converting circuit 350 has the same frequency as the output signal h of the three-input OR gate 330 and has a delay for 1/6 cycle from the external clock signal e.

The waveform generating circuit 270 outputs an output signal m. The signal level of the output signal m becomes "H" as the signal level of the output signal h of the three-input OR gate 330 becomes "H". The signal level of the output signal m becomes "L" as the signal level of the output signal i of the fourth digital/delay converting circuit 350 becomes "H".

According to the fourth embodiment, the frequency of the internal clock signal a is n times higher than the frequency of the external clock signal or 1/n times lower than the frequency of the external clock signal and the duty ratio of the internal clock signal can be freely changed.

FIG. 15 is a block diagram showing a phase compensating apparatus according to a fifth embodiment of the present invention.

According to the fifth embodiment, the phases of an internal clock signal a and an external clock signal e can be deviated by a predetermined amount.

In the circuit according to the fifth embodiment shown in FIG. 15, similar portions to those according to the third embodiment shown in FIG. 10 are denoted by similar reference numerals and the description thereof is omitted.

In FIG. 15, a third calculating circuit 410 calculates a phase deviating amount for an output signal b that has been delayed for (t cycle−t cd) from an external clock signal e, so that the phase of the external clock signal is deviated by a predetermined phase amount against one cycle "t cycle". In this embodiment, the third calculating circuit 410 decreases one cycle "t cycle" of the external clock signal to 1/4.

A fifth digital/delay converting circuit 420 delays an output signal b of a first digital/delay converting circuit 220 for "t cycle/4" calculated by the third calculating circuit 410, and supplies the resultant signal as an output signal j to a waveform generating circuit 270.

A fourth calculating circuit 430 calculates the duty ratio of the internal clock signal a so as to perform a calculation for decreasing one cycle "t cycle" of the external clock signal e to 1/n. In this embodiment, the fourth calculating circuit 430 performs a calculation for decreasing one cycle "t cycle" of the external clock signal e to 1/2.

A sixth digital/delay converting circuit 440 delays an output signal j of a fifth digital/delay converting circuit 420 for "t cycle/2" calculated by the fourth calculating circuit 430, and supplies the resultant signal as an output signal k to the waveform generating circuit 270.

The waveform generating circuit 270 generates an output signal m. The signal level of the output signal m becomes "H" as the signal level of the output signal j of the fifth digital/delay converting circuit 420 becomes "H". The signal level of the output signal m becomes "L" as the signal level of an output signal k of a sixth digital/delay converting circuit 440 becomes "H".

Figure 16:
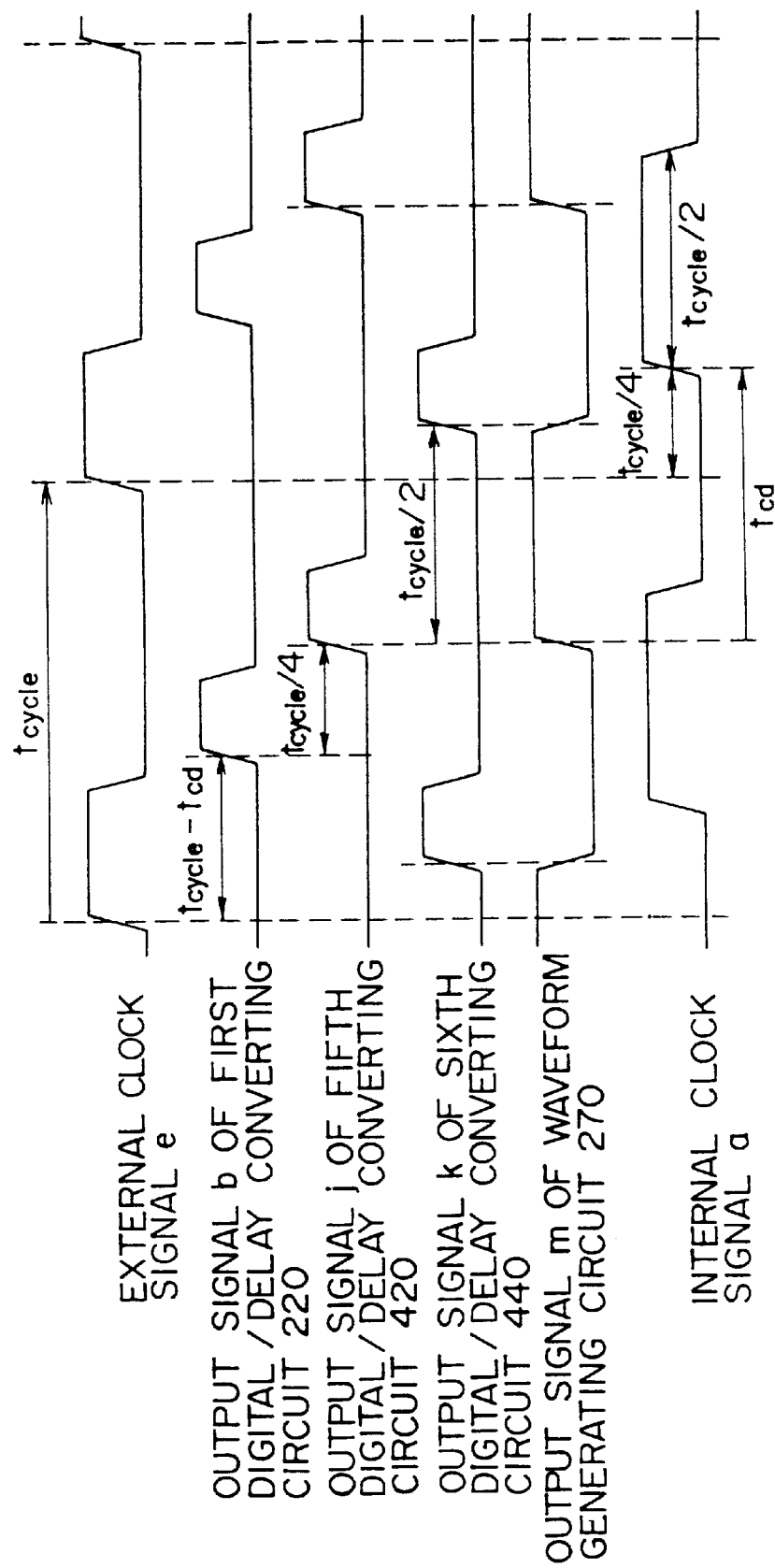
FIG. 16 is a timing chart of the phase compensating circuit of the fifth embodiment.

Next, the operation of the circuit shown in FIG. 15 will be described with reference to a timing chart shown in FIG. 16.

The fifth digital/delay converting circuit 420 outputs the output signal j which is the output signal b of the first digital/delay converting circuit 220 that has been delayed for "t cycle/4".

The sixth digital/delay converting circuit 440 outputs the output signal k which is the output signal j that has been delayed for "t cycle/2".

The waveform generating circuit 270 outputs the output signal m. The signal level of the output signal m becomes "H" as the signal level of the output signal j of the fifth digital/delay converting circuit 420 becomes "H". The signal level of the output signal m becomes "L" as the signal level of the output signal k of the sixth digital/delay converting circuit 440 becomes "H". In other words, the signal level of the output signal m becomes "H" with a delay of (t cycle−t cd+t cycle/4) against the external clock signal e. The duty ratio of the output signal m is 50% "t cycle/2".

Thus, the internal clock signal a received from the clock distributing circuit 230 is delayed for "t cycle/4" that is the delay amount calculated by the third calculating circuit 410 from the external clock signal e. The duty ratio of the clock signal a becomes "t cycle/2" (50%) calculated by the fourth calculating circuit 430.

According to the fifth embodiment, when the calculation of the third calculating circuit 410 is changed, the phases of the internal clock signal a and the external clock signal e can be varied by a predetermined amount.

Moreover, in the above-described embodiments, by averaging digital data that is output from the first to sixth delay/digital converting circuits or digital data that is output from the calculating circuits, the calculation error of the delay time period of the digital/delay converting circuits due to noise or the like can be reduced. When the present invention is applied for a PLL circuit of an LSI device, the PLL circuit can be composed of only digital circuits. Thus, the characteristics of the circuit become stable.

According to the present invention, since only digital circuits are used to match the phase of the output signal with the phase of the input signal, without the need to use analog circuits such as a charge pump and a low pass filter, a phase compensating apparatus with a short lock time and high stability can be realized.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A phase compensating apparatus comprising:
    phase difference compensation signal outputting means for outputting a signal, obtained by delaying an external clock signal based on digital delay time data, for compensating for a phase difference between the external clock signal and an internal clock signal;
    a structural element for receiving the signal outputted from said phase difference compensation signal outputting means and outputting the internal clock signal; and
    delay time detecting means for receiving the signal outputted from the phase difference compensation signal outputting means and the internal clock signal and detecting a difference between a delay caused by the structual element and a cycle of the external clock signal based on the received signals, and outputting the detected difference as digital delay time data to said phase difference compensation signal outputting means.

2. The phase compensating apparatus as set forth in claim 1, wherein a delay added by said phase difference compensation signal outputting means makes a total of the delay and the delay caused by the structural element equal to an integer multiple of the cycle of the external clock signal, whereby the phase of the internal clock signal accord with the phase of the external clock signal.

3. A phase compensating apparatus comprising:
    delay time detecting means for subtracting a delay time period of an internal signal having a delay, with respect to an input signal, from the cycle of the input signal and outputting the result as digital delay time data;
    phase difference compensation signal outputting means for delaying the input signal corresponding to the digital delay time data so as to compensate for the phase difference between the input signal and the internal signal to produce a first output signal;
    delaying means for delaying the first output signal corresponding to a setting value which becomes a desired delay to produce a second output signal; and
    waveform generating means for generating a resultant signal corresponding to the first output signal and the second output signal and outputting the resultant signal.

4. The phase compensating apparatus as set forth in claim 3,
    wherein said waveform generating means generates and outputs the resultant signal whose signal level becomes "H" as the signal level of the first output signal becomes "H", and whose signal level becomes "L" as the signal level of the second output signal becomes "H".

5. The phase compensating apparatus as set forth in claim 3,
    wherein the resultant signal causes the phase of the internal signal to be the same as the phase of the input signal and causes a waveform of the internal signal to have a desired duty ratio corresponding to the setting value.

6. A phase compensating apparatus comprising:
    first delay/digital converting means for outputting digital delay time data having a value corresponding to a time period measured from when a signal level of a second signal, having a delay with respect to a first signal, becomes "H" or "L" until a signal level of the first signal becomes "H" or "L";
    first digital/delay converting means for outputting the first signal corresponding to an input signal delayed according to the digital delay time data;
    a cycle detecting circuit for detecting the cycle of the input signal;
    a calculating circuit for calculating an "H" level period or "L" level period of a signal that has a cycle detected by said cycle detecting circuit and that has a desired duty ratio;
    second digital/delay converting means for outputting a third signal corresponding to the first signal delayed for a time period corresponding to the "H" or "L" level calculated by said calculating circuit; and
    a waveform generating circuit for generating a signal whose signal level varies as the signal level of the first signal or the signal level of the third signal becomes "H" or "L".

7. The phase compensating apparatus as set forth in claim 6,
    wherein said calculating circuit performs one of shifting each bit of the third signal by one bit, and shifting each bit of the input signal by 2 bits.

8. The phase compensating apparatus as set forth in claim 6, further comprising:
a clock distributing circuit for distributing an output signal of said waveform generating circuit as an internal clock signal and for outputting a portion of the internal clock signal to said first digital/delay converting means as the second signal,
wherein said first delay/digital converting means outputs digital delay time data based on a delay amount of the first signal corresponding to the internal clock signal, and
said first digital/delay converting means outputs, as the first signal, a signal corresponding to an external clock signal supplied as the input signal delayed based on the digital delay time data so that the phase of the external clock signal accords with the phase of the internal clock signal.

9. The phase compensating apparatus as set forth in claim 6,
wherein said cycle detecting circuit has a second delay/digital converting means for outputting a period of one cycle of the input signal as a second digital delay time data.

10. A phase compensating apparatus comprising:
first delay/digital converting means for outputting digital delay time data having a value corresponding to a time period measured from when a signal level of a second signal, having a delay with respect to a first signal, becomes "H" or "L" until a signal level of the first signal becomes "H" or "L";
first digital/delay converting means for outputting the first signal corresponding to an input signal delayed according to the digital delay time data;
a cycle detecting circuit for detecting the cycle of the input signal;
a first calculating circuit for calculating a delay amount for the first signal;
second digital/delay converting means for delaying the first signal based on the delay amount calculated by said first calculating circuit;
a second calculating circuit for calculating an "H" level period or an "L" level period of a signal that has a cycle detected by said cycle detecting circuit and that has a desired duty ratio;
an OR circuit for ORing output from said first signal digital/delay converting means and an output signal of said second digital/delay converting circuit;
third digital/delay converting means for delaying an output signal of said OR circuit based on the "H" or "L" level period; and
a waveform generating circuit for generating a signal whose signal level varies as the signal levels of the output signals of said OR circuit and said third digital/delay converting means becomes "H" or "L".

11. The phase compensating apparatus as set forth in claim 10, further comprising:
fourth digital/delay converting means for delaying an output signal of said second digital/delay converting means based on the delay amount calculated by said first calculating circuit,
wherein said OR circuit ORs the output signals of said first digital/converting means, said second digital/converting means, and said fourth digital/converting means.

12. The phase compensating apparatus as set forth in claim 11,
wherein said waveform generating circuit is adapted for generating a signal whose signal level becomes "H" as the signal level of the output signal of said OR circuit becomes "H", and whose signal level becomes "L" as the signal level of the output signal of said third or fourth digital/delay converting means becomes "H".

13. A phase compensating apparatus comprising:
first delay/digital converting means for outputting digital delay time data having a value corresponding to a time period measured from when a signal level of a second signal, having a delay with respect to a first signal, becomes "H" or "L" until a signal level of the first signal becomes "H" or "L";
first digital/delay converting means for outputting the first signal corresponding to an input signal delayed according to the digital delay time data;
a cycle detecting circuit for detecting the cycle of the input signal;
a first calculating circuit for calculating a delay amount for the first signal;
second digital/delay converting means for delaying the first signal by the calculated delay amount for the first signal;
a second calculating circuit for calculating an "H" level period or "L" level period of a signal that has a cycle detected by said cycle detecting circuit and that has a desired duty ratio;
third digital/delay converting means for delaying an output signal of said second digital/delay converting means by the "H" or "L" level period; and
a waveform generating circuit for generating a signal whose signal level varies as the signal levels of output signals of said second digital/delay converting means and said third digital/delay converting means becomes "H" or "L".

14. The phase compensating apparatus as set forth in claim 13, further comprising:
a clock distributing circuit for distributing the output signal of said waveform generating circuit as an internal clock signal,
wherein said second digital/delay converting means delays the first signal by the delay amount calculated by said first calculating circuit and causes said clock distributing circuit to output the internal clock signal with a predetermined phase difference against the input signal.

15. The phase compensating apparatus as set forth in claim 13,
wherein said waveform generating circuit generates a signal whose signal level becomes "H" as the signal level of the output signal of said second digital/delay converting means becomes "H", and whose signal level becomes "L" as the signal level of the output of said third digital/delay converting means becomes "H".

16. The phase compensating apparatus as set forth in claim 13,
wherein said first calculating circuit designates an amount of delay for shifting the phase of an internal clock signal from the phase of an external clock signal supplied as the input signal.

17. A delay controlling circuit, comprising:
delay/digital converting means for outputting digital delay time data indicating a delay by a structural element in a subsequent stage between a measurement start signal and a measurement end signal; and digital/delay converting means for delaying an input signal based on the digital delay time data to produce a resultant signal, and outputting the resultant signal to the structural element in the subsequent stage.

18. The delay controlling circuit as set forth in claim 17, wherein the input signal is an external clock signal, the measurement end signal is a signal which is the external clock signal that has been delayed for the digital delay time data, and the measurement start signal is an internal clock signal that has a delay from the measurement end signal.

19. A delay controlling circuit, comprising:

a delay/digital converting circuit for outputting delay time data corresponding to a delay by a structural element in a subsequent stage between a measurement start signal and a measurement end signal;

calculating means for performing a predetermined calculation on the delay time data; and digital/delay converting means for outputting to the structural element in the subsequent stage a signal based on the input signal delayed by an amount indicated by said calculating means.

20. The delay controlling circuit as set forth in claim 19, wherein the input signal is an external clock signal, the measurement end signal is a signal corresponding to an external clock signal delayed based on the delay time data, and the measurement start signal is an internal clock signal having a delay with respect to the measurement end signal.

21. A phase compensating apparatus comprising:

a phase difference compensation signal outputting circuit for outputting a signal, obtained by delaying an external clock signal based on digital delay time data, for compensating for a phase difference between the external clock signal and an internal clock signal;

a structural element for receiving the signal outputted from said phase difference compensation signal outputting circuit and outputting the internal clock signal; and a delay time detecting circuit for receiving the signal outputted from said phase difference compensation signal outputting circuit and the internal clock signal and detecting a difference between a delay caused by the internal structural element and a cycle of the external clock signal based on the received signals, and outputting the detected difference as the digital delay time data to said phase difference compensation outputting circuit.

22. A phase compensating apparatus for compensating for a phase difference between an input signal having a cycle and an internal signal, the phase compensating apparatus comprising:

a first delay/digital converting circuit for subtracting a delay time period introduced by a structural element in a subsequent stage between the input signal and a second signal from the cycle of the input signal to produce digital delay time data; and a first digital/delay converting circuit for delaying the input signal based on the digital delay time data and outputting a resultant signal to the structural element in the subsequent stage.

23. A phase compensating method for compensating for a phase difference between an input signal having a cycle and an internal signal, the method comprising the steps of:

subtracting a delay time period introduced by a structural element in a subsequent stage between the internal signal and the input signal, from a cycle of the input signal to produce digital delay time data; and delaying the input signal based on the digital delay time data to compensate for a phase difference between the input signal and the internal signal and outputting the delayed input signal to the structural element in the subsequent stage.

24. A phase compensating method, comprising the steps of:

outputting a value corresponding to a time period introduced by a structural element in a subsequent stage after a signal level of a second signal becomes "H" or "L" until the signal level of a first signal becomes "H" or "L" as digital delay time data; and outputting a signal which is an input signal that has been delayed according to the digital delay time as the first signal to the structural element in the subsequent stage.

25. A delay controlling method, comprising the steps of:

outputting a delay introduced by a structural element in a subsequent stage between a measurement start signal and a measurement end signal as digital delay time data; and delaying an input signal for the digital delay time data and outputting a resultant signal to the structural element in the subsequent stage.

* * * * *